United States Patent [19]
Oi et al.

[11] Patent Number: 5,761,075
[45] Date of Patent: Jun. 2, 1998

[54] APPARATUS FOR DESIGNING PHOTOMASKS

[75] Inventors: Kazuko Oi, Tokyo; Kiyomi Koyama, Kanagawa-ken, both of Japan

[73] Assignee: Kabushiki Kaisha Toshiba, Kawasaki, Japan

[21] Appl. No.: 657,597

[22] Filed: May 31, 1996

Related U.S. Application Data

[62] Division of Ser. No. 365,218, Dec. 28, 1994, Pat. No. 5,541,025.

[30] Foreign Application Priority Data

Dec. 28, 1993 [JP] Japan ................... 5-335048
Jun. 30, 1994 [JP] Japan ................... 6-150000

[51] Int. Cl.⁶ ........................................ G06F 15/00
[52] U.S. Cl. ................... 364/488; 364/489; 364/490; 364/491; 430/5
[58] Field of Search ..................... 364/488–491; 430/5, 311–312, 548

[56] References Cited

U.S. PATENT DOCUMENTS

| | | | |
|---|---|---|---|
| 5,298,365 | 3/1994 | Okamoto et al. | 430/311 |
| 5,300,786 | 4/1994 | Brunner et al. | 250/548 |
| 5,358,807 | 10/1994 | Okamoto | 430/5 |
| 5,362,584 | 11/1994 | Brock et al. | 430/5 |
| 5,443,931 | 8/1995 | Watanabe | 430/5 |
| 5,538,815 | 7/1996 | Oi et al. | 430/5 |

OTHER PUBLICATIONS

Hirai et al., "Augomatic Pattern Generation System For Phase Shifting Mask", *Symposium On VLSI Technology Digest of Technical Papers*, pp. 95–96, (1991).

Wong et al., "Investigating Phase-shifting Mask Layout Issues Using A CAD Toolkit", *IEDM Technical Digest*, pp. 705–708, (1991).

Moniwa et al., "Algorithm For Phase-Shift Mask Design With Prioirty On Shifter Placement", *Jpn. J. Appl. Phys.*, vol. 32:5874–5879, (1993).

*Primary Examiner*—James P. Trammell
*Assistant Examiner*—Vuthe Siek
*Attorney, Agent, or Firm*—Foley & Lardner

[57] ABSTRACT

Method and apparatus for designing the photomask in the course of designing the Levenson-type phase shift mask, capable of automatically arranging the shifter, of not causing a contradictory spot in a circuit designing stage and of automatically forming a final layout achieving maximum integrity. The method includes the steps of: forming symbolic layout data in which a distance between adjacent clear areas is set to an arbitrary value; determining regions having a mutual phase difference 0° or 180° of light transmitting through adjacent patterns corresponding to the clear areas in the symbolic layout data; executing compaction of the symbolic layout in a manner that design rule S1 is adopted to the clear areas neighboring with the phase difference of 180° and design rule S2 is adopted to the clear areas neighboring with the phase difference of 0°; and forming mask layout data such that S1 is less than S2.

4 Claims, 10 Drawing Sheets

↔ S3
☐ PATTERN HAVING PHASE 0°
▨ PATTERN HAVING PHASE 180°

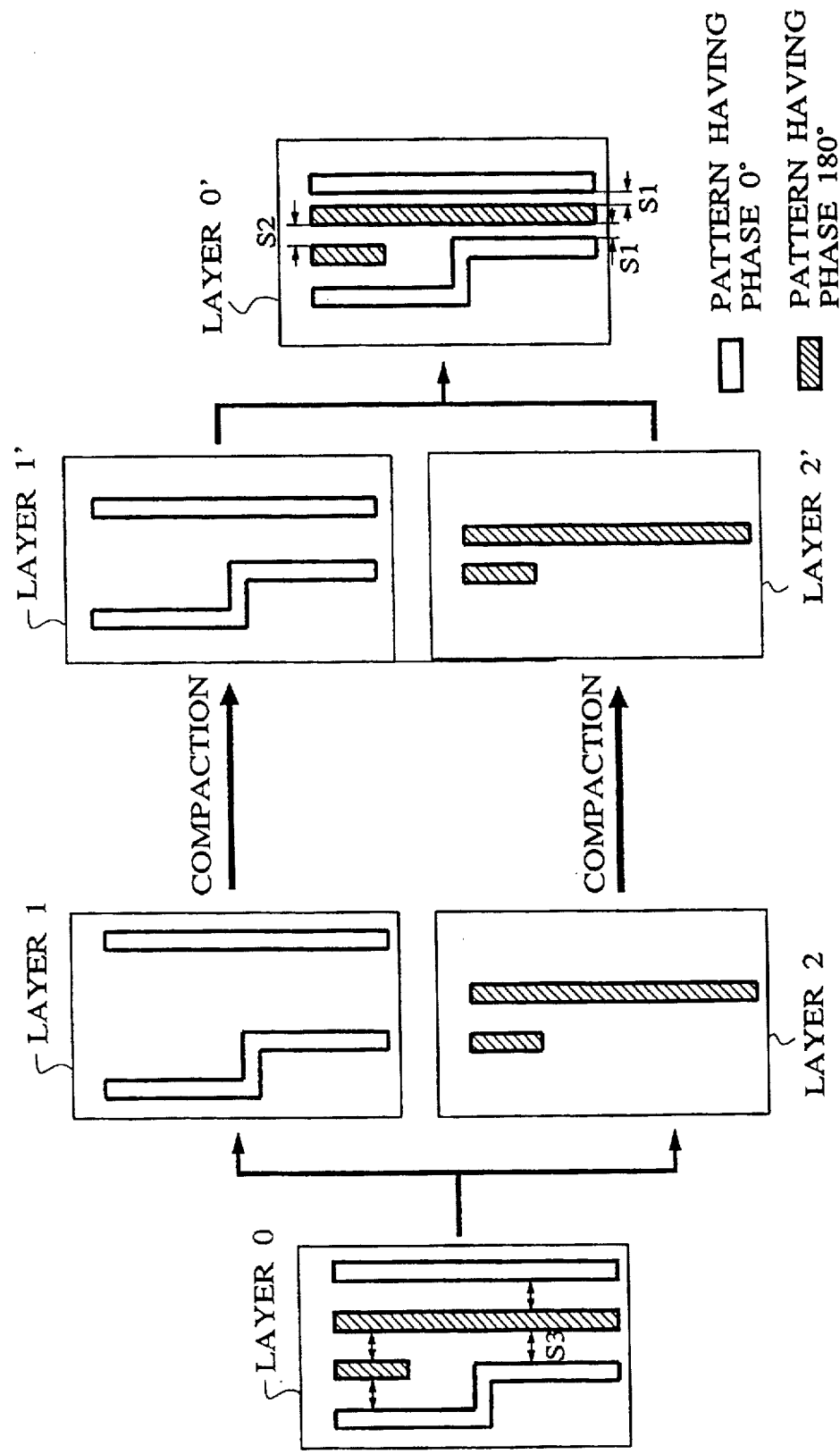

▨ OPENING PORTION HAVING PHASE 180°

☐ OPENING PORTION HAVING PHASE 0°

⬚ CIRCUMSCRIBING RECTANGLE

FIG.10
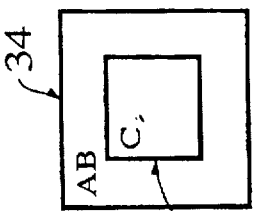
(a) contact 0
A : FIRST Aℓ WIRING PATTERN
B : SECOND Aℓ WIRING PATTERN
C : CONTACT PATTERN
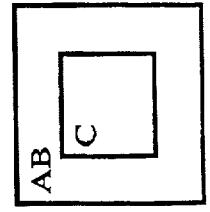
(b) contact 1
A : FIRST Aℓ PHASE SHIFT WIRING PATTERN
B : SECOND Aℓ PHASE SHIFT WIRING PATTERN
C : CONTACT
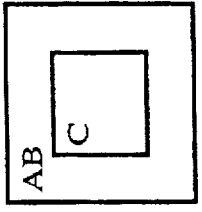
(c) contact 2
A : FIRST Aℓ WIRING PATTERN
B : SECOND Aℓ PHASE SHIFT WIRING PATTERN
C : CONTACT PATTERN
(d) contact 3
A : FIRST Aℓ PHASE SHIFT WIRING PATTERN
B : SECOND Aℓ WIRING PATTERN
C : CONTACT PATTERN

APPARATUS FOR DESIGNING PHOTOMASKS

This application is a division, of application Ser. No. 08/365,218, filed Dec. 28, 1994 now U.S. Pat. No. 5,541, 025.

BACKGROUND OF THE INVENTION

1. Technical Field

The present invention relates to method and apparatus for designing a photomask for use with production of a semiconductor device, and it particularly relates to the method and apparatus for designing a phase-shifting mask which is suitable for projecting a miniaturized pattern for the semiconductor device production.

2. Background Art

A photomask on which an original mask pattern of a VLSI is drawn is irradiated by an incident ray which is partially coherent. The photomask will be simply referred to as a mask hereinafter. Patterns on the mask are projected on to a semiconductor wafer so as to execute photo lithography. For a projection lithography system realizing the photolithography system, there is required a further miniaturized pattern to be copied on to the wafer.

The minimum feature size of the pattern fabricated is expressed by a degree of resolution therefor. The resolution is evaluated by how accurately two adjacent exposed regions on a resist coated semiconductor substrate can be separated without being overlapped, by utilizing, say, a mask pattern whose light transmissive regions and light shielding regions are periodically changed. In order to improve the minimum resolution, there is known a method where phase difference is given to the incident ray which passes pair of adjacent light transmissive regions on the mask.

As for the method where the phase difference is given to the incident ray which passes a pair of adjacent light transmissive regions on the mask, such a method is conventionally known and discussed in a paper- entitled "Improving Resolution in Photolithography with a Phase-Shifting Mask" written by Mark D. Levenson et al. (IEEE Transaction on Electron Devices, Vol ED-29 No. 12, 1982, page 1828).

FIG. 2 shows a Levenson type phase shifting mask suggested by the above paper. In the same figure, on mask substrate 14 there are formed a plurality of light-shielding (opaque) regions 16 and light transmissive regions serving as the original images for the patterns, and there is provided phase shifter 15 which supplies a phase difference between the incident rays passing through the clear region. The phase shifter 15 is made of transparent material against the incident rays. Phase shifter 15 is arranged on either side of a pair of the adjacent light transmissive regions. The phase shifter 15 may be simply referred to as a shifter hereinafter.

The shifter needs to satisfy a condition of $$d=\lambda/\{2(n-1)\},$$

where d is film thickness of the shifter, n an index of refraction and λ a wavelength of the incident ray. There is a phase difference between the ray which passed through the shifter and other transmission rays that didn't pass through the shifter, so that light intensity of the ray a pattern boundary under a light shielding region on the semiconductor substrate becomes near zero. As a result thereof, adjacent regions are separated, thus improving the resolution therefor.

In connection with the paper discussing the Levenson type phase shifting mask and an automatic designing apparatus therefor, there is a paper entitled "Automatic Pattern Generation System for Phase Shifting Mask" authored by Noboru Nomura et al. (Symposium on VLSI Technology, JSAPCAT No. AP911210, pp. 95–96, Oiso, Japan, May 1991). Nomura et al's technique will be referred to as a first conventional art hereinafter. In Nomura et al's paper, a dynamic random access memory (DRAM) is designed by making use of the apparatus for automatically designing the Levenson type phase shifting masks. In the event the phases of light rays passing through the pattern contained in input layout are automatically determined, firstly an arbitrary pattern is selected so that its phase is set to 0°. Thereafter, the phase of the other arbitrary (or the phase-to-be determined) pattern is set opposite to the phase-to-be-determined pattern which has a longest side, among patterns whose phases are already determined; when there exist a plurality of patterns facing the longest sides to the phase-to-be determined pattern, a system of Nomura et al. gives warning and aborts a processing.

Moreover, as a second conventional art, there is another paper entitled "Investigating Phase-shifting Mask Layout Issues Using a CAD Toolkit" written by Andrew R. Neureuther et al. (IEDM Technical Digest, pp705–708, 1991). This paper discusses about an automatic designing system where a circuit designer determines a shrink factor for an input layout, the phase of the light rays passing through the pattern in the layout are automatically assigned against the shrank pattern, and, if there is a portion where the phase assignments conflict, such portion is notified to the designer.

Moreover, as a third conventional art, there is still another paper entitled An Automatic Shifter Pattern Generator for Levenson-type PSMS written by Kazuko Ooi et al. Extended Abstracts of the 53rd Autumn Meeting 1992: The Japan Society of Applied Physics No. 2 p478, lecture no.16P-L-11). In this third conventional art, when the spacing between the light tranmissive regions contained in input layout is less than a threshold value, opposite phases are assigned to the pair of the light transmissive regions, and when there exists a conflict spot during the phase assignment, such a spot is notified to the designer. Ooi et al discusses such a method and apparatus which has functions of a phase assignment and a verification against a partially phase-assigned layout.

Moreover, as a fourth conventional art, there is still another paper entitled "Algorithm for Phase Shift Mask Design with Priority on Shifter Placement" written by Akemi Moniwa et al. (Digest of Papers Microprocess. '93, pp50–51, 1993). In this paper discussing the phase assignment method, firstly pairs of adjacent light transmissive regions (or apertures) having spacings less than a threshold value are made. These pairs are given weightings, respectively and starting from a pair having heavier weighting factors, the mutual phases are determined to be opposite, so that the conflict spots will occur in a pair having lighter weighting factors.

In the above described first, third and fourth conventional arts, phases are assigned in the geometrically fixed layout. Thus, whether or not there exists a conflict spot in the layout is determined already at a stage of making the layout. For example, referring to FIG. 1, it is impossible to arrange shifters without causing a conflict spot. For instance, in the first conventional art, arrangement will be proper until phase 0° is given to light transmissive region (pattern) 11 and then phase 180° is given to light transmissive region (pattern) 12. However, when a phase is assigned to light transmissive region 13, contradiction will be caused. This is because the light transmissive region 13 is facing to transmissive region 12 in the upper portion indicated by x and facing to transmissive region 11 in the lower portion indicated by y in FIG. 1, and the lengths of side facing with the light transmissive region 13 and light transmissive region 11 are same, and because phase of light transmissive region 11 differs from that of light transmissive region 12, so that a proper phase can not be assigned to the light transmissive region 13, thus causing the contradiction. Even if the order of assigning the phases is changed, it is not possible to arrange the shifter without causing the contradiction.

Moreover, in the third conventional art referring to FIG. 1, when phase 0° is assigned to the light transmissive region 11 and phase 180° is assigned to both the light transmissive regions 12 and 13 which are neighboring to the clear region 11 having spacing within the threshold, the same phase is assigned to both the light transmissive regions 12 and 13 each of which is neighboring to the other within the threshold spacing, thus causing contradiction. In other words, referring to the light transmissive regions 11 and 13, they are adjacent to each other within the threshold (≤) in a lower region indicated with y in FIG. 1.

Similarly, in the fourth conventional art, the light transmission disposed adjacent to each other need to have opposite phases to each other. Thus, it is impossible to arrange shifters without causing a conflict spot in the layout shown in FIG. 1. In these layouts having contradictory spots (conflict spots), the circuit designer will be required to modify the layout until he/she could eliminate such conflict spots. Since the circuit designer will spend much time in modifying such conflict spots manually, such manual operation is very inefficient.

Moreover, in the second conventional art, a whole layout is scaled down by providing the input layout with certain uniform shrink factor. Thus, the number of conflict spots will increase as the scale-down operation proceeds. In this second conventional art too, the circuit designer is required to modify the layout about presented conflict spots.

As described above, when the phases are assigned after the layout is completed in the course of designing the Levenson-type phase shifting mask, there often exist conflict spots in the layout. Thus, the designer needs to engage himself/herself in modifying the conflict spots, thus deteriorating designing efficiency. This drawback is a major problem in application of the Levenson-type phase shifting mask.

SUMMARY OF THE INVENTION

In view of the foregoing drawbacks, it is therefore an object of the present invention to provide method and apparatus for designing the photomask in the course of designing the Levenson-type phase shift mask, which are capable of automatically assigning the phases, without causing a contradictory spot in a circuit designing stage, and automatically forming a final layout achieving maximum, integration density so as to improve the designing efficiency significantly.

According to the present invention, there is provided a method for designing a phase shifting mask, comprising the steps of: forming symbolic layout data in which a spacing between adjacent light transmissive areas is set to an arbitrary value; assigning opposite phases (0° or 180°) to the pairs of adjacent light transmissive regions in the symbolic layout data; executing compaction of the symbolic layout in a manner that minimum spacing (or design rule) S1 is adopted to the pairs of adjacent light transmissive regions which have the phase difference of 180°, and minimum spacing (or design rule) S2 is adopted to the pairs of adjacent light transmissive regions which have the phase difference of 0°; and forming mask layout data such that S1 is less than S2.

There is also provided apparatus for designing a phase shifting mask, which comprises: means for forming symbolic layout data; means for executing first compaction on a phase-shift applied layer by design rule that is an arbitrary value; means for assigning phases (either 0° or 180°) to nets composed of electrically equivalent elements in the compaction-executed phase-shift applying layer; and means for executing second compaction in a manner that design rule S2 is adopted to pairs of nets having same phase and design rule S1 is adopted to pairs of nets having opposite phase, where spacing S1 is less than S2.

BRIEF DESCRIPTION OF THE DRAWINGS

These and other objects, features and advantages of the present invention will become more apparent from the following description of the preferred embodiment taken in conjunction with the accompanying drawings, in which:

FIG. 6 shows procedures for the compaction.

FIG. 10 shows contact patterns according to the second embodiment.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

In a designing apparatus for realizing the following embodiments, there may be utilized an ordinary computer equipped with a CPU which executes various processings, an input system such as a keyboard, a mouse, a light pen, and an external system such as a memory unit and disk unit, and an output system such as a display, printer. In this case, an arithmetic processing and so on are executed in an processing portion in the CPU, and storage of each datum is performed in the memory unit and external system in the CPU.

BASIC IDEA

Figure 1:
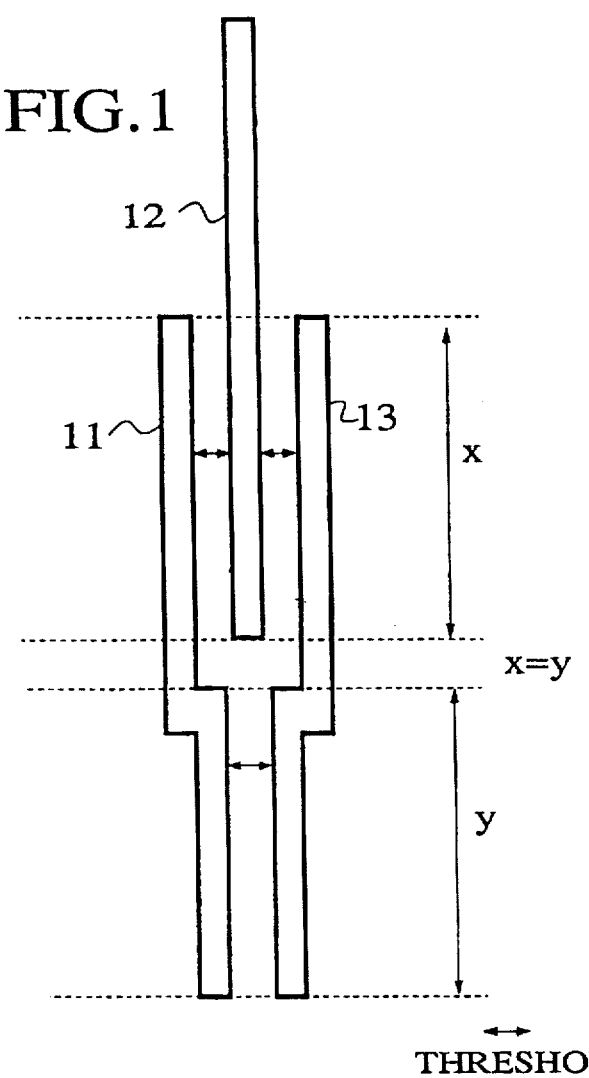
FIG. 1 shows an exemplary pattern layout for explaining conventional practices.
Figure 2:
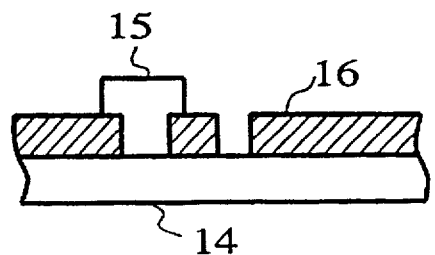
FIG. 2 shows a phase shifter 15 in relation to a light-shielding region 16 and a mask substrate 14.
Figure 3:
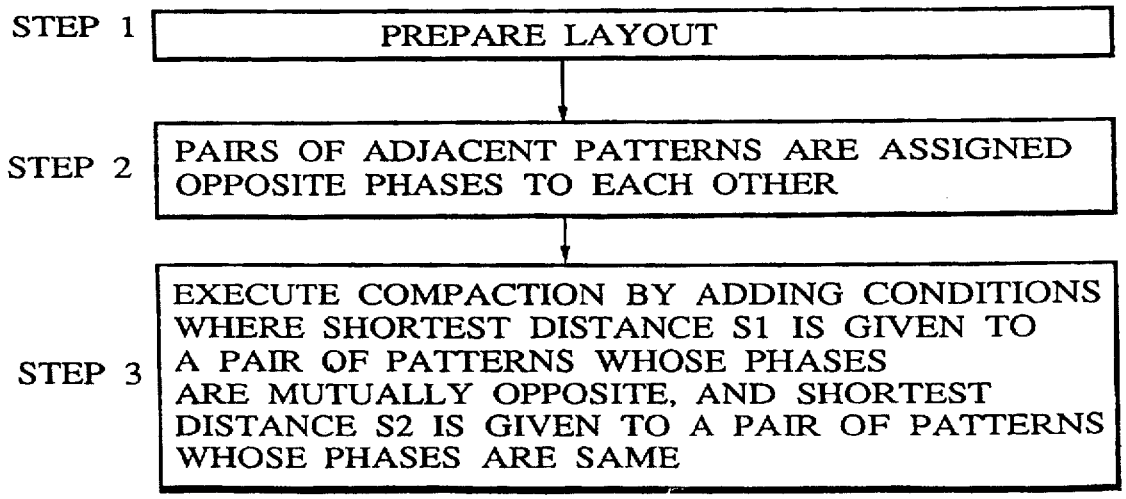
FIG. 3 shows a flowchart of phase assignment technique according to the basic idea of the present invention.

FIG. 3 shows a flowchart for assigning phases to light transmissive (or clear) regions according to a basic method for the present invention. Referring to FIG. 3, layout data are made so that a minimum spacing between neighboring patterns (that is, between adjacent light transmissive regions) is an arbitrary spacing S3 as shown in STEP 1. Step 1 may be carried out manually by a circuit designer, or may be performed by an automatic designing software utilizing the above described computer. Possibly, a symbolic layout which ignores a design rule (minimum linewidth and minimum spacing) can be formed first and then, and the compaction can be executed on the thus-formed symbolic layout so that the minimum spacing between the neighboring patterns is S3.

In general, a symbolic layout is a schematic layout diagram described by only utilizing relative positions of circuit comprising elements such as a transistor, contact and wire. In other words, the symbolic layout is a dimensionless layout in which only relative positions between symbols are specified; the symbols may be wire, transistor, contact and so on. Compaction is defined to be that the schematic layout diagram (symbolic layout) is automatically converted to a final mask pattern in accordance with a design rule. A tool used therefor is called a compactor. In other words, the symbolic layout is converted into a final mask layout by compactor software which minimizes the mask area, fulfilling design rules at the same time.

Some of exemplary ways for determining the (step 2) will be described below.

FIRST EXAMPLE

The minimum spacing between patterns in the layout is measured. Then pairs of neighboring patterns having the minimum spacing of S3 is memorized. Tracing thus memorized neighboring relationship, the phase is assigned in a manner that a pair of neighboring patterns are assigned opposite phases to each other. Then, when there exists a contradictory spot or conflict spot, the phase assignment procedure is continued while the contradictory spot is left as such. Here, the contradictory or conflict spot indicates a spot where the neighboring patterns have the same phase to each other.

Figure 4A:
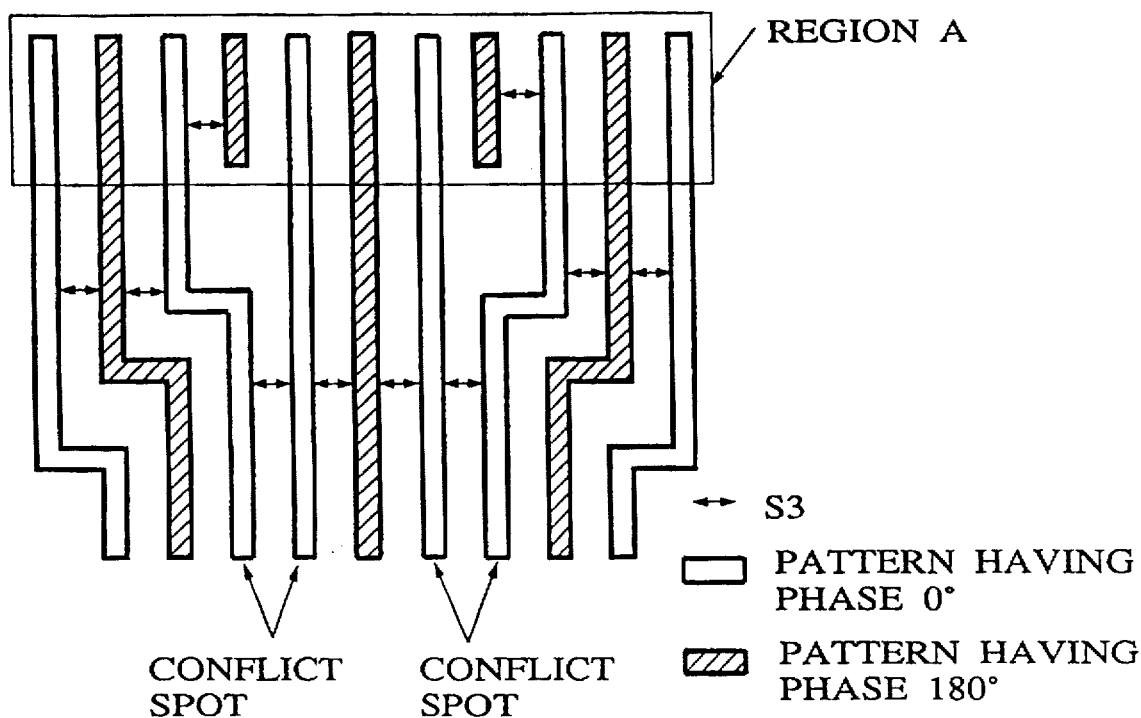
FIG. 4A shows a result where the phases are assigned in the layout where adjacent patterns are designed in terms of minimum distance of S3.

As an applied example for this first example, the phases may be assigned in the following manner. The designer assigns phases specifically in an important region in the layout. Referring to FIG. 4A, suppose that the region A enclosed by a rectangle in an upper portion of the layout is an important one. Therefore, the phases are assigned 0° and 180° alternately.

SECOND EXAMPLE

Figure 5A:
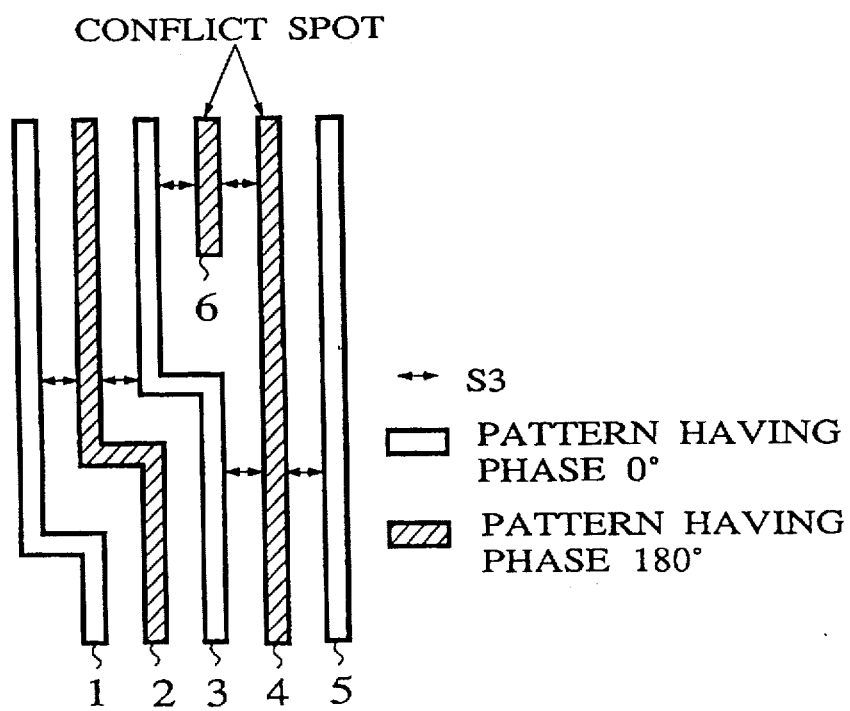
FIG. 5A shows a result where the phases are assigned in the layout where the patterns are designed in terms of minimum distance S3.

Spacings between the patterns in input layout data are measured. Then, among the pairs of patterns which are neighboring to each other within the spacing of S3, a priority is given to a pair of patterns where the length of sides facing less than S3 is longer, so that the pair of the patterns is assigned opposite phase to each other (see FIG. 5A). Referring to FIG. 5A, the phases are assigned opposite to each other in the order of the pair of patterns 4-5, 2-3, 1-2, 3-4, 3-6, 6-4. As a result thereof, a pair of patterns 6-4 bears a contradictory spot.

THIRD EXAMPLE

Here, as a phase assigning technique, neighboring relationship of patterns is obtained from the relation whether or not the minimum spacing between the patterns in the mask layout is less than a threshold value. It is possible that the neighboring relationship is expressed by a graph where each line segment thereof is weighted. (Here, the neighboring relationship is expressed as the graph in which each pattern is represented by a node and neighboring patterns are connected by a line segment.) Then, the lights transmitting through the patterns corresponding to nodes on a single line segment are assigned opposite phases, starting from a line segment having a greater weighting. Then the conflict spots may appear on smaller weighted line segments.

Furthermore, as a conditions for the weighting of the line segments for above-said graph, at least one of the following weighting techniques, or combination thereof may be adopted:

(1) Greater weighting is given for less minimum spacing between patterns;

(2) Greater weighting is given for a shorter side of patterns facing each other within the threshold;

(3) Heavier weighting is given to a side of the graph included in greater number of closed loops;

(4) Greater weighting is given for pattern regions having less area within the threshold; and (5) Weighting is given at discretion of the circuit designer.

In other words, after pairs of patterns adjacent within the threshold are made, the weighting is given to each pair of the patterns. Then, in the order of the pair of patterns having less weighting factor toward heavierweighting factor, the opposite phases are assigned; heavier weighting patterns can be modified more easily. Even though the spots having the same phase might be caused thereby, they will bring almost no detrimental affect.

After the phases are assigned as described above, the layout is shrunk as much as possible by utilizing a conventionally available program called a compactor (STEP 3 in FIG. 3). The compactor is a kind of computer-aided design (CAD) software, and has function of contracting area of the input layout as much as possible while satisfying various constraints or conditions. Moreover, a usual compactor can perform compaction so that consistency between plural layers can be kept. However, the usual compactor accepts the symbolic layout as an input. Therefore, there may be a case where the layout thus formed above need be input to the compactor after it is translated into the symbolic layout.

Referring to FIG. 6, a pair of patterns having opposite phase to each other is given condition of the minimum spacing being S1, while the pair having same phase is given condition of the minimum spacing S2 for the compactor. The inter-pattern spacing S1 and S2 are the minimum spacings (design rule) of patterns where line are and space patterns are resolvable when the pattern-transmitting lights opposite phases, and of the same phases, respectively. Naturally, S2 is greater than S1 (S1<S2). Though S3 can be any arbitrary value, suppose that S3 is equal or greater than S2. In this embodiment, though not specifically defined in this specification, a minimum line width of pattern itself is generally determined in advance in the course of circuit designing. Moreover, in the layout, *there generally exist various layers in addition to a phase-shift applied layer and a phase-shift-pattern output layer. A most suitable design rule will be applied to each layer for its compaction.

Referring still to FIG. 6, a group of patterns to which 0° is assigned as a result of phase assignment, is moved to layer 1, while a group of patterns of 180° is moved to layer 2. Thereafter, pairs of patterns on the same layer are separated by more than S2, and other pairs of patterns belonging to different layers are separated by more than S1. When the compaction is executed with the above condition, there are formed layer 1' and layer 2' shown in FIG. 6. Thereafter, synthesizing these layers, there is formed layer 0'. The layer 0' represents a phase-shift applied layer, and either blank patterns or hatched patterns correspond to the phase-shift pattern.

Figure 4B:
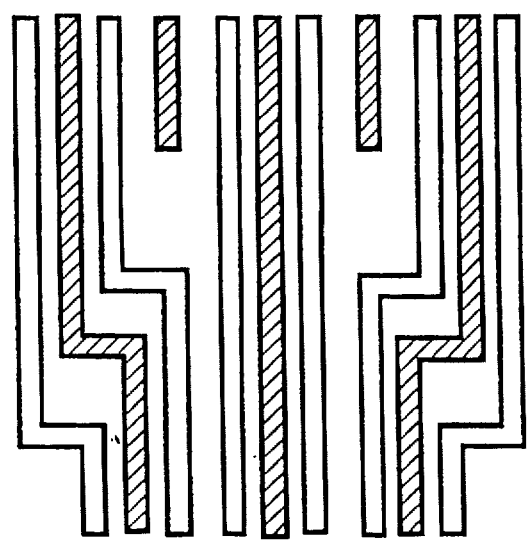
FIG. 4B shows a result where the layout of FIG. 4A is compaction-executed.
Figure 5B:
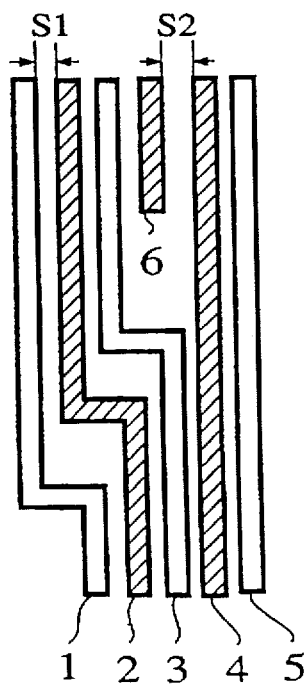
FIG. 5B shows a result where the layout of FIG. 5A is compaction-executed.

The results of compaction executed omitting other layers and using only the condition of S1 for the pair of patterns having opposite phases and S2 for the pair of patterns having the same phases are shown in FIG. 4B and FIG. 5B, respectively. In these examples, the compaction was executed only in X direction, since no patterns is arranged in the Y direction. Here, the X direction indicates the direction vertical to the lines in figures, and the Y direction indicates the direction along the lines.

First Embodiment

Figure 7:
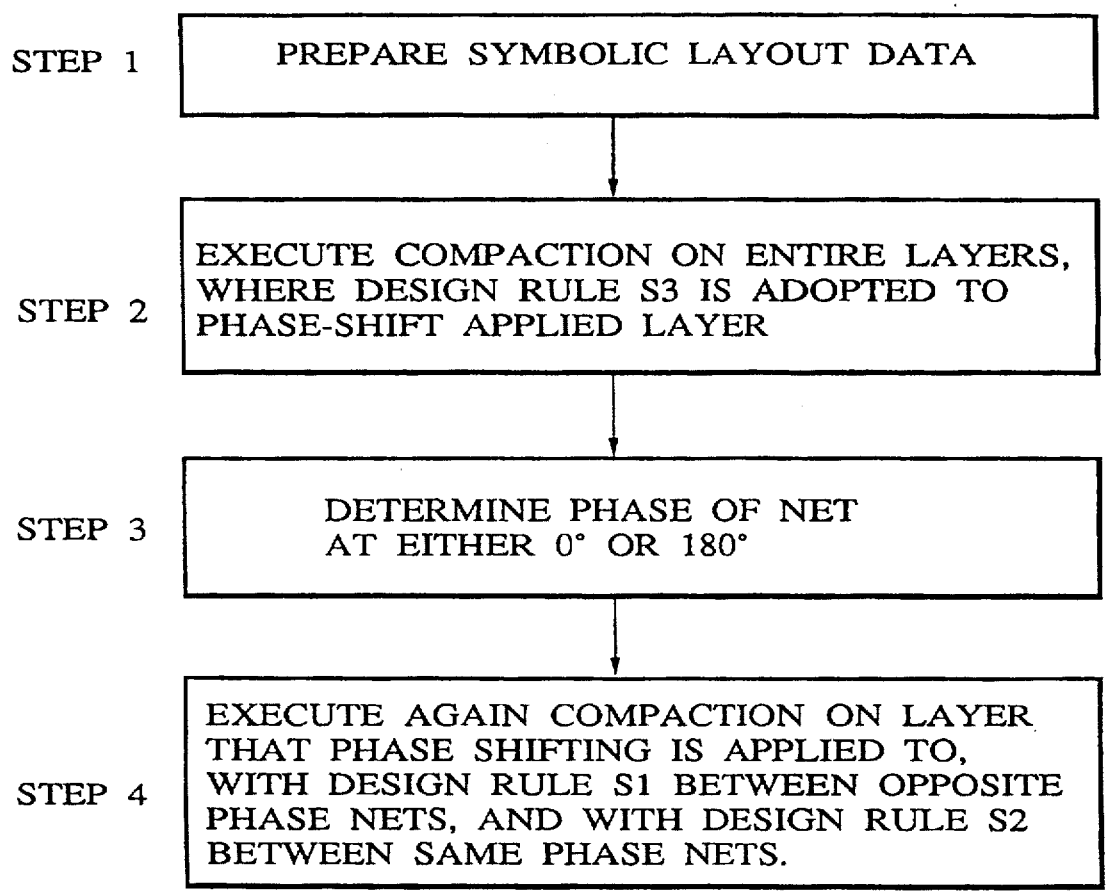
FIG. 7 shows a flowchart of phase assignment technique according to the first embodiment of the present invention.

FIG. 7 is a flow chart showing procedure for designing phase shift masks according to a first embodiment based on the basic idea.

Referring to FIG. 7, firstly, symbolic layout data are prepared (STEP 1). The symbolic layout data may be manually formed by the circuit designer, or may be made by utilizing an automatic designing software. It is also possible that the data are made by converting the conventionally available mask layout to the symbolic layout.

Thereafter, the compaction is executed on the phase-shift applied layer by the design rule S3 (STEP 2). As for layers other than the phase-shift applied layer, each appropriate design rule therefor shall be utilized. Thereby, the design rules are fulfilled and the conversion process is performed so that the mask area, or the chip size is minimized.

An output of the above compaction will be either the compaction-executed (or compacted) symbolic layout or the mask layout. Regardless of the layout, the phase of the light transmitting against a net in the layout is determined (STEP 3 in FIG. 7). In other words, it is determined to which light transmissive region in the layout a phase of 180° is to be assigned, and to which light transmissive region phase of 0° is to be assigned. In this phase determination, the opposite phase will be assigned as much as possible when the minimum spacing between nets is S3. In the case of the compaction-executed symbolic layout, the net indicates collection of electrically equivalent elements, while the net indicates a continuous light transmissive region on the mask in a case of the mask layout.

Specifically speaking, the phase will be assigned in the following manner.

The minimum spacing between the nets of the symbolic layout or mask layout is measured. The opposite phase is assigned as much as possible to a pair of nets whose spacing is S3. To a pair of the nets whose spacing is greater than S3, the same or opposite phase will be assigned.

After the phases are assigned as described- above, the layout is compaction-executed as much as possible by utilizing again the compactor's program (STEP 4 in FIG. 7). Then, as for the phase-shift applied layers, there are utilized conditions which include design rule S2 between the same phase nets, and design rule S1 between the opposite phase nets. Here, S1 indicates a resolution limit spacing for a pair of openings having the opposite phases on the mask, or a somewhat greater than the resolution limit spacing. S2 indicates another resolution limit spacing for a pair of openings having the same phase on the mask, or a somewhat greater than the resolution limit spacing. Though the magnitude of S3 may be arbitrary, it is preferably greater than S2. Here, the values of S1, S2 and S3 are those corresponding to the practical minimum spacings of patterns on a semiconductor chip.

Figure 8A:
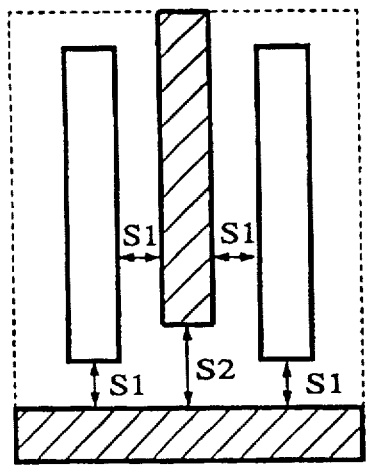
FIGS. 8A, 8B, 8C and 8D show four different results of layouts obtained after the compaction is executed on four types of phase assignment results.
Figure 8B:
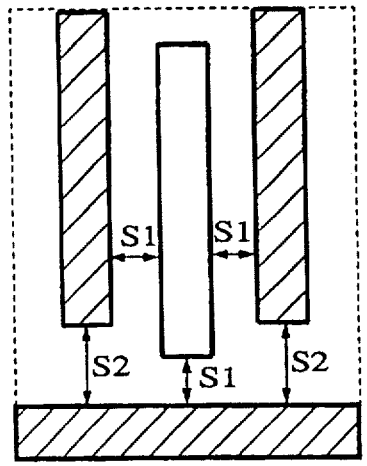
Figure 8C:
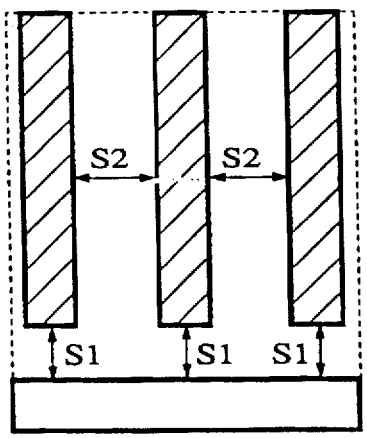
Figure 8D:
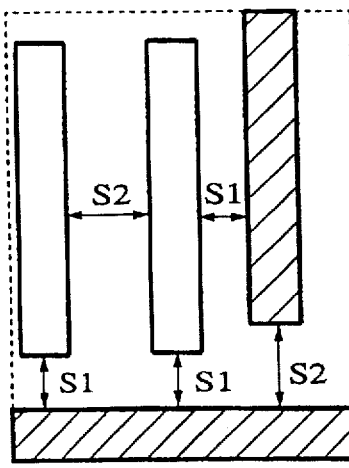

When there are plural types of phase assignment results in STEP 3 in FIG. 7, the compaction is executed on each phase assignment result (STEP 3), and then a layout whose mask area is minimum is selected. For example, FIGS. 8A–8D show four different results of layouts obtained after the compaction is executed on four types of phase assignment methods. Among FIGS. 8A–8D, the area occupied by the layout is minimum in the phase assignment method of FIG. 8C. In this case, the layout represented by FIG. 8C is selected.

Next, STEP 4 in FIG. 7 will be described in detail. The net to which the phase of 180° is assigned in the symbolic layout is moved to a phase-shift-pattern output layer. Here, in among the symbolic layout, the pattern is not defined directly in the layer. Rather, the pattern is defined temporarily in the symbols, and the symbols are defined in the symbolic layout. Therefore, the pattern can not be moved directly from the phase-shift applied layer to the phase-shift-pattern output layer. Instead, some symbols are replaced by its derivative symbols. A method therefor will be described below referring to FIG. 9–FIG. 11.

Second Embodiment

Figure 9:
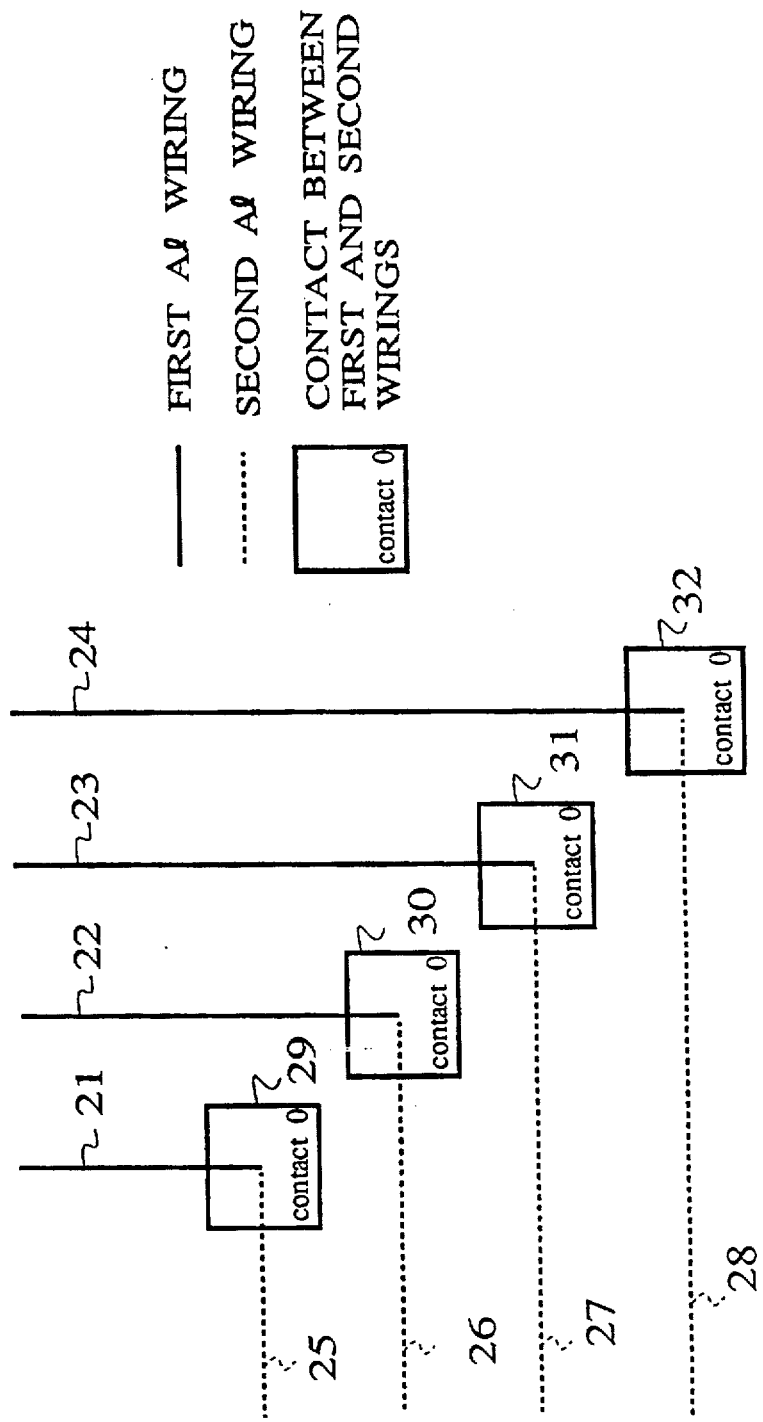
FIG. 9 illustrates the second embodiment of the present invention.
Figure 11:
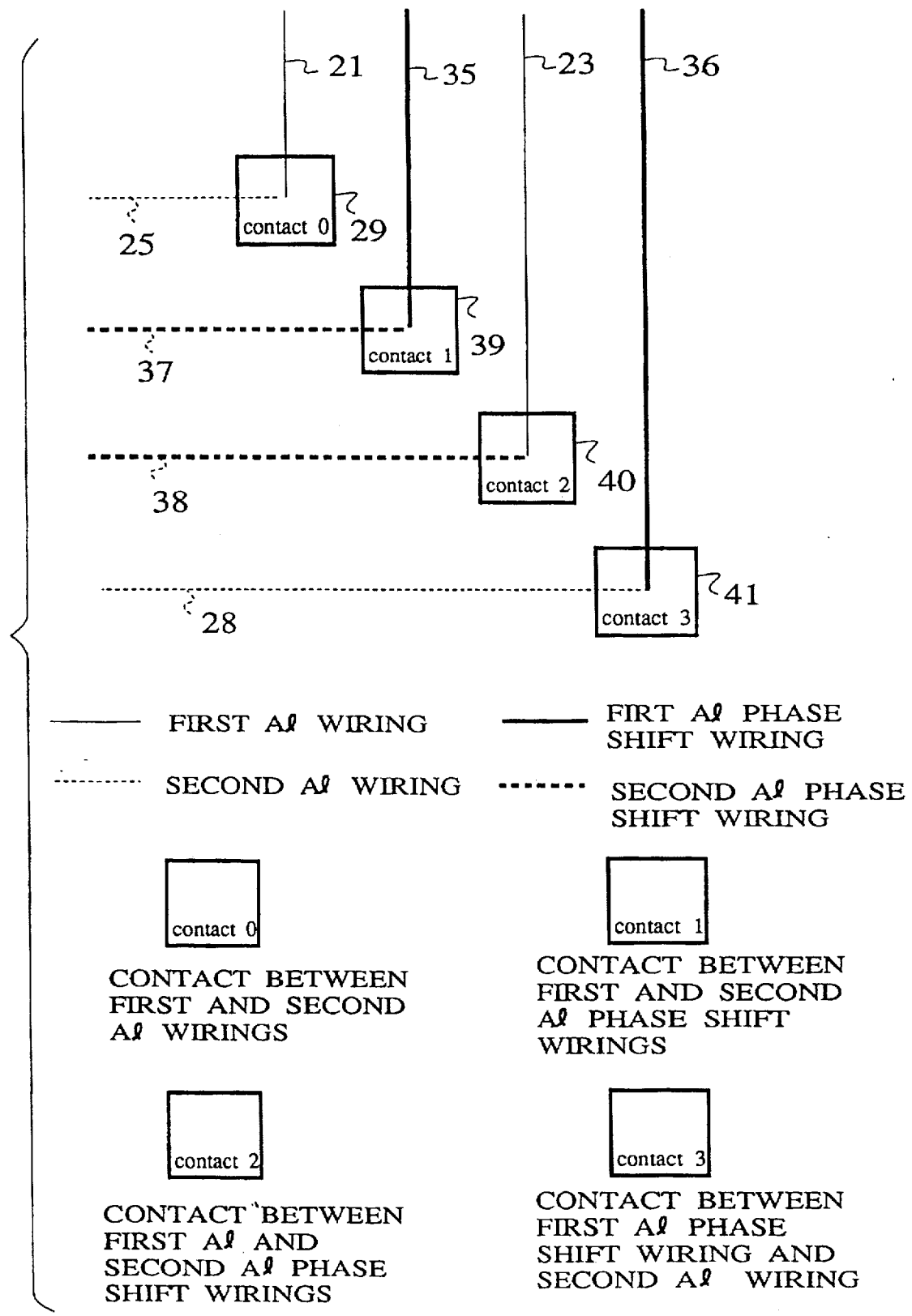
FIG. 11 illustrates an example when the second embodiment is applied.

Referring to FIG. 9, suppose that the phase-shift applied layers are the first aluminum and the second aluminum. Assume that, as a result of phase assignments in each layer, the phase of 180° are assigned to the first aluminum's patterns which are included in symbols 22, 24, 30, 32 and the second aluminum's patterns included in symbols 26, 27, 30, 31, respectively. Then, since each wiring includes only a single layer of the phase-shift applied layer in symbols, it suffices that the symbols 22, 24, 26, 27 are simply replaced with symbols 35, 36, 37, 38 using the phase-shift-pattern-output layer (FIG. 11).

Symbols 29, 30, 31, 32 are contacts between the first and second aluminum wirings, and specific patterns for these symbols are expressed in FIG. 10(a). In FIG. 10(a), the first aluminum wiring pattern A and the second aluminum wiring pattern B are of square shape 34, and contact portion 33 is of square shape 33 which is smaller than the shape 34. Accordingly, the symbol for the contact includes two phase-shift applied layers, and thus four types of derivative symbols need be formed as shown in FIG. 10(a) FIG. 10(b) FIG. 10(c) and FIG. 10(d). Utilizing these four types of symbols, contacts 30–32 in FIG. 9 are replaced by contacts 39–41. For example, contact 31 should consist of a contact between the first aluminum wiring and the second aluminum phase shift wiring, so that it is replaced by contact 2 shown in FIG. 10(c)

Namely, in a case where each symbol includes n of phase-shift applied layers (where n indicates an integer greater than one), it will be required to form $2^n$ types of derivative symbols in combination of the phase-shift applicable layer and its phase-shift-pattern output layer. That is, when n is two, there will be required four different types of contacts. Though the wiring and the contact were used as an example for symbol here, the situation will be the same when other symbol such as transistor is used. Moreover, though described above is the symbol including one or two layers of phase-shift applicable layer, the case with more than three layers is similar thereto.

By the above-described technique, after patterns having phase of 180° in the phase-shift applicable layer are moved to the phase-shift-pattern output layer, the compaction is executed by the compactor providing the design rule about the phase-shift applicable layer and the phase-shift-pattern output layer. This design rule includes the design rule S2 between patterns included in the same layer, and the design rule S1 between the pattern included in the phase-shift applicable layer and that included in the phase-shift-pattern output layer.

A spacing between patterns in specific locations may be designated as constraints for the compactor. For this purpose, the circuit designer may provide a specific-valued design rule which is to be applied in between the patterns in those specific locations, and which differs from that of S1 and S2.

As a result of having executed the compaction, there will be automatically generated the mask layout which is designed by the design rule S2 for use with patterns having the same phase, and the design rule S1 for patterns having the opposite phase. Thereafter, in order to form mask drawing data, a logical sum (OR) of the phase-shift applicable layer and the phase-shift-pattern output layer is taken so as to be first mask drawing data. Then, either of the phase-shift-pattern output layer or the phase-shift applicable layer is chosen, so that then chosen layer is re-sized if necessary and can serve as second mask drawing data.

Figure 12:
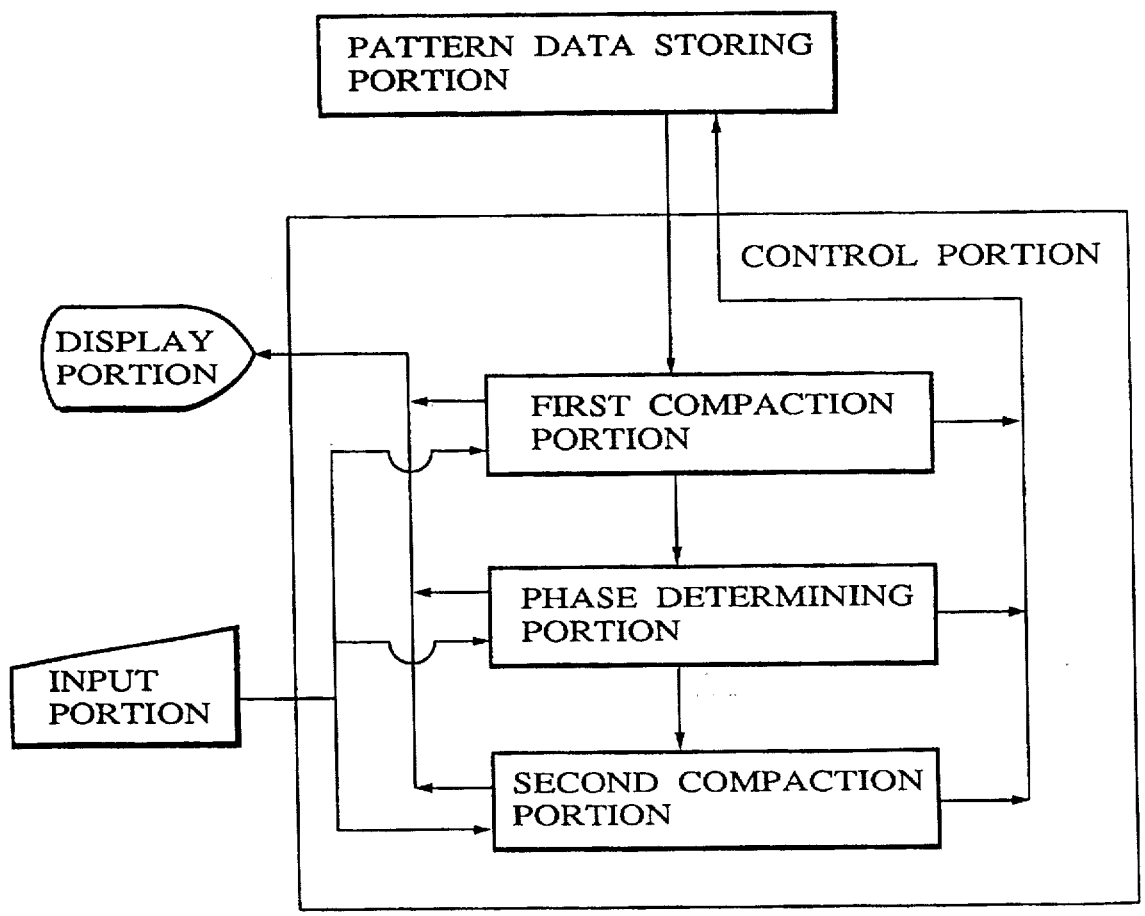
FIG. 12 illustrates apparatus for automatic phase assignment according to the first embodiment.

FIG. 12 shows the preferable structure of apparatus for performing automatic phase assignment which comprises:

(1) an input portion where the circuit designer controls the processing of the apparatus;

(2) a first compaction means which executes the compaction by the design rule that is an arbitrary value, about the phase-shift applied layer in the symbolic layout data;

(3) a phase assigning means which determines the phase (0° or 180°) of net (composed of electrically equivalent elements) in the the phase-shift applicable layer which is compaction-executed in the above (2);

(4) a second compaction means which executes again the compaction in a manner that the spacing between a pair of nets having the same phase is given the design rule S2, and the spacing between a pair of nets having the opposite phases is given the design rule S1, based on the result obtained from the phase assigning means (3), where S1<S2;

(5) a pattern data storing portion which interacts with a control portion composed of the first compaction means, the phase assigning means and the second compaction means; and (6) a display means which displays the result of phase shifter arrangement and which is connected to the control portion.

In summary, by implementing the method and apparatus for designing the photomask according to the present invention, once the layout is completed, the phase shifters are automatically arranged, so that a final layout that is maximally compacted can be formed, thus significantly improving designing efficiency. Moreover, the present invention can be applied to optimally designing Application-Specific Integrated Circuits (ASIC) where oftentimes the layout is formed automatically by a CAD software. That is to say, according to the present invention, the Levenson-type phase shift masks can be applied to broader fields of products.

Moreover, the optimum arrangement is selected even in the event that there exist plural candidates of phase shifter arrangements, so that minimum-area-occupying mask layout can be obtained.

Moreover, the symbolic layout data can have phase information therein, so that the Levenson-type phase shift masks can be applied to wide range of products.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. An apparatus for designing a phase shifting mask where a phase shifter giving a phase difference to incident ray transmitting a transmissive area is arranged on the transmissive area of the mask having the transmissive areas and light shielding areas thereon, the apparatus comprising:

means for forming symbolic layout data, where the symbolic layout data corresponds to dimensionless layout data in which design rules are ignored and only relative positions between symbols are specified;

means for executing first compaction on a phase-shift applied layer by a first design rule that has an arbitrary value as a minimum inter-pattern distance;

means for assigning a phase of a net composed of electrically equivalent elements in the compaction-executed phase-shift applicable layer, to either 0° or 180°; and means for automatically executing second compaction in a manner that a second design rule that has a first minimum inter-pattern distance is adopted to a pair of nets having same phase and a third design rule that has a second minimum inter-pattern distance is adopted to a pair of nets having opposite phase, where the second minimum inter-pattern distance is less than the first minimum inter-pattern distance.

2. The apparatus of claim 1, wherein the assigning means includes:

means for executing again the first compaction so as to form mask data in a manner that, when there exist plural types of assignment results, the first compaction is again executed against each assignment result such that the second design rule is given to an inter-pattern distance for a pair of nets having the same phase while the third design rule is given to an inter-pattern distance for a pair of nets having the opposite phases; and means for selecting a portion of mask data by which a size of a mask area therefor becomes minimum among data corresponding to the plural types of assignment results.

3. An apparatus for designing a phase shifting mask having at least a first, a second and a third transmissive area, a first light shielding area between the first and the second transmissive areas, and a second light shielding area between the second and the third transmissive areas in a manner that a phase shifter of the mask is arranged on one of the first, second and third transmissive areas so that a phase difference between the transmissive area on which the phase shifter is arranged and the other transmissive area is set to 180°, the apparatus comprising:

means for forming symbolic layout data in which a spacing between the adjacent transmissive areas is set to an arbitrary value, the symbolic layout data corresponds to dimensionless layout data in which design rules are ignored and only relative positions between symbols are specified;

means for determining regions having a mutual phase difference of 0° or 180° of light transmitting through the adjacent transmissive areas in the symbolic layout data means for automatically executing a compaction of the symbolic layout data in a manner that a minimum spacing between transmissive data areas neighboring with the phase difference of 180° is S1 and a minimum spacing between transmissive areas neighboring with the phase difference of 0° is S2; and means for forming mask layout data such that S1 is less than S2.

4. An apparatus for designing a set of mask layers, at least one of the mask layers is a phase-shift applied layer, the phase-shift applied layer is formed in a manner that a phase difference between light transmitted through first transmissive area with the phase shifter and the light transmitted through second transmissive area without the phase shifter is set to 180°, the phase-shift applied layer having a light shielding area between the first and the second transmissive areas arranged adjacent to the first transmissive area, the apparatus comprising:

means for forming first symbolic layout data in which a spacing between the adjacent transmissive areas is set to an arbitrary value, the first symbolic layout data corresponds to dimensionless layout data in which design rules are ignored and only relative positions between symbols are specified;

means for executing first compaction on a phase-shift applied layer by a design rule that has an arbitrary value of minimum spacing;

means for determining regions having a mutual phase difference of 0° or 180° of light transmitting through the adjacent first and second transmissive areas in the first symbolic layout data;

means for forming more than two and less than $2^n$ (inclusive) types of derivative symbols by combination of the phase-shift applied layer and a phase-shift-pattern output layout thereof, in the event that an element constituting the symbolic layout includes n phase-shift applied layers, where n indicates a positive integer;

means for forming second symbolic layout data having symbols which are replaced by their derivative symbols according to the results of the regions;

means for executing second compaction of the second symbolic layout data, in a manner that a design rule S1 having a minimum spacing of S1 is adopted to the transmissive areas neighboring with the phase difference of 180°, and a design rule S2 having a minimum spacing of S2 is adopted to the transmissive areas neighboring with the phase difference of 0°; and means for forming mask layout data such that S1 is less than S2.

* * * * *